US011621706B2

(12) United States Patent
Lee et al.

(10) Patent No.: US 11,621,706 B2
(45) Date of Patent: Apr. 4, 2023

(54) COMPLEMENTARY CLOCK GATE AND LOW POWER FLIP-FLOP CIRCUIT INCLUDING SAME

(71) Applicant: RESEARCH & BUSINESS FOUNDATION SUNGKYUNKWAN UNIVERSITY, Suwon-si (KR)

(72) Inventors: Yoon Myung Lee, Suwon-si (KR); Gi Cheol Shin, Suwon-si (KR)

(73) Assignee: Research & Business Foundation Sungkyunkwan University, Suwon-si (KR)

(*) Notice: Subject to any disclaimer, the term of this patent is extended or adjusted under 35 U.S.C. 154(b) by 0 days.

(21) Appl. No.: 17/496,941

(22) Filed: Oct. 8, 2021

(65) Prior Publication Data

US 2022/0131533 A1 Apr. 28, 2022

(30) Foreign Application Priority Data

Oct. 28, 2020 (KR) .................. 10-2020-0141329

(51) Int. Cl.
*H03K 3/012* (2006.01)
*H03K 3/356* (2006.01)
*H03K 19/20* (2006.01)
*H03K 3/037* (2006.01)
*H03K 3/3562* (2006.01)

(52) U.S. Cl.
CPC ....... *H03K 3/356104* (2013.01); *H03K 3/012* (2013.01); *H03K 3/037* (2013.01); *H03K 3/35625* (2013.01); *H03K 19/20* (2013.01)

(58) Field of Classification Search
CPC ............ H03K 3/012; H03K 3/356104; H03K 3/3562; H03K 3/35625
See application file for complete search history.

(56) References Cited

U.S. PATENT DOCUMENTS

2013/0147534 A1* 6/2013 Cheng ................ H03K 3/35625
327/202
2017/0063350 A1* 3/2017 Cheng ................ H03K 3/35625

FOREIGN PATENT DOCUMENTS

KR 10-1699241 B1 1/2017

OTHER PUBLICATIONS

Korean Notice of Submission of Opinions dated Nov. 17, 2021 in corresponding Korean Patent Application No. 10-2020-0141329. (5 pages in Korean).
Korean Office Action dated Jul. 5, 2022, in counterpart Korean Patent Application No. 10-2020-0141329 (7 pages in Korean).

* cited by examiner

*Primary Examiner* — Patrick O Neill
(74) *Attorney, Agent, or Firm* — NSIP Law

(57) ABSTRACT

A complementary clock gate, includes a NOR gate configured to receive a data signal D and a signal QI; a first P-type transistor gated by an output value of the NOR gate; and a NAND gate, connected in series to the first P-type transistor, configured to receive a clock signal CK and an inverted data signal DN, and output an inverted clock signal CKB.

4 Claims, 5 Drawing Sheets

[FIG. 1]

-- Related Art --

|  | TGFF | Proposed |
|---|---|---|
| 1V | P | P |
| 950mV | P | P |
| 900mV | P | P |
| ⋮ | ⋮ | ⋮ |
| 550mV | P | P |
| 500mV | P | P |
| 450mV | P | P |
| 400mV | P | P |
| 350mV | P | P |
| 300mV | F | F |
| 250mV | F | F |

COMPLEMENTARY CLOCK GATE AND LOW POWER FLIP-FLOP CIRCUIT INCLUDING SAME

CROSS-REFERENCE TO RELATED APPLICATIONS

This application claims the benefit under 35 USC 119(a) of Korean Patent Application No. 10-2020-0141329 filed on Oct. 28, 2020, in the Korean Intellectual Property Office, the entire disclosure of which is incorporated herein by reference for all purposes.

BACKGROUND

1. Field

The present disclosure relates to a complementary clock gate and low power flip-flop circuit including same.

2. Description of the Related Art

A C2MOS flip-flop circuit of the related art includes a plurality of transistors. The C2MOS flip-flop circuit of the related art is a simple inversion output circuit that outputs CKB when a CK is input.

Figure 1:
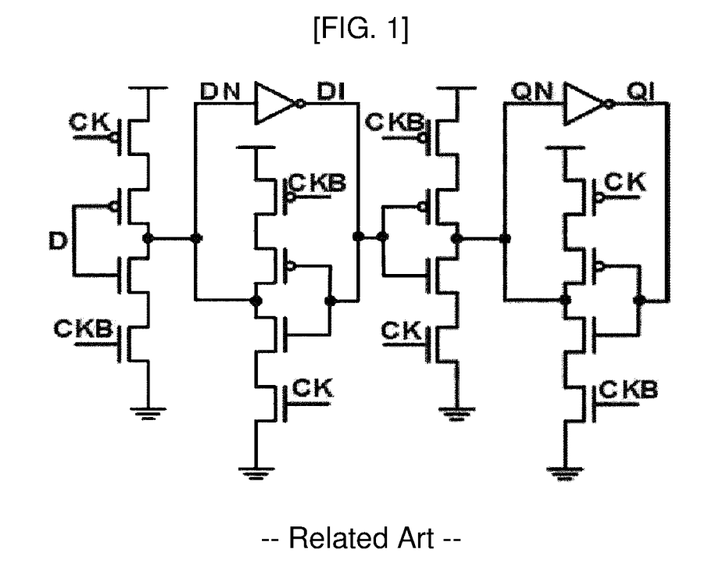
FIG. 1 is a C2MOS flip-flop circuit of the related art.

FIG. 1 is a C2MOS flip-flop circuit of the related art.

The structure and operation of the C2MOS flip-flop are well-known so that a detailed description thereof is omitted.

Here, D denotes a data signal, DN denotes an inverted data signal, DI denotes an inverted data signal of DN, CK denotes a clock signal, CKB is an inverted clock signal, Q denotes an output signal, QN denotes an inverted output signal, and QI denotes an inverted output signal of QN.

An input and an output of each transistor included in the C2MOS flip-flop circuit of the related art may be used to gate a clock signal supplied to a clock input of the flip-flop. Therefore, clock switching is necessarily requested.

The flip-flop's redundant clock switching/transistors may cause a high dynamic power and a large area. Accordingly, a new flip-flop circuit that prevents redundant clock switching and maintains a characteristic tolerant of the process variation is demanded.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a complementary clock gate, includes a NOR gate configured to receive a data signal D and a signal QI; a first P-type transistor gated by an output value of the NOR gate; and a NAND gate, connected in series to the first P-type transistor, configured to receive a clock signal CK and an inverted data signal DN, and output an inverted clock signal CKB.

The NAND gate may include a second P-type transistor, connected in series to the first P-type transistor, gated to the clock signal CK; a first N-type transistor, connected in series to the second P-type transistor, gated to the inverted data signal DN; a second N-type transistor, connected in series to the first N-type transistor, gated to the clock signal CK; and a third P-type transistor, configured to receive a power voltage, gated to the inverted data signal DN. The third P-type transistor may have a drain connected to a first node connected to a drain of the second P-type transistor and a drain of the first N-type transistor, and the drain of the third P-type transistor may be configured to output the inverted clock signal CKB.

In another general aspect, a complementary clock gate includes a first circuit, including a first N-type transistor configured to receive a data signal D and connected in series to a first P-type transistor, and a second N-type transistor configured to receive a signal QI. The first P-type transistor is configured to receive a signal QN and a power voltage, and is gated by an output value of the first circuit. A NAND gate, connected in series to the first P-type transistor, is configured to receive a clock signal CK and an inverted data signal DN to output an inverted clock signal CKB. The signal QI is an inverted signal of the signal QN.

The NAND gate may include a second P-type transistor connected in series to the first P-type transistor and gated to the clock signal CK; a first N-type transistor connected in series to the second P-type transistor and gated to the inverted data signal DN; a second N-type transistor connected in series to the first N-type transistor and gated to the clock signal CK; a first node connected to a drain of the second P-type transistor and a drain of the first N-type transistor; and a third P-type transistor configured to receive a power voltage and is gated to the inverted data signal DN. The third P-type transistor may have a drain connected to the first node connected to the drain of the second P-type transistor and the drain of the first N-type transistor, and the drain of the third P-type transistor may output an inverted clock signal CKB.

In another general aspect, a low-power flip-flop circuit includes a first circuit configured to receive a data signal to output an inverted data signal DN; a second circuit configured to receive the inverted data signal DN of the first circuit and output a DI signal, wherein the DI signal is an inverted signal of the inverted data signal; a third circuit configured to receive the DI signal and a clock signal, and output an output signal QN dependent on the data signal when the clock signal is high; and a fourth circuit configured to store an output signal value of the third circuit.

The first circuit may include a first P-type transistor, configured to receive a power voltage, gated by the clock signal CK; a second P-type transistor, connected in series to the first P-type transistor, gated by the data signal D; a first N-type transistor, connected in series to the second P-type transistor, gated by the data signal D; and a second N-type transistor, connected in series to the first N-type transistor N11, gated by an inverted clock signal CKB. A drain of the second P-type transistor and a drain of the first N-type transistor may be connected to a first node to output an inverted data signal.

The second circuit may include a first inverter configured to receive the inverted data signal from the first node to output a signal DI; a third P-type transistor, configured to receive a power voltage, gated by an inverted clock signal CKB; a third N-type transistor, connected in series to the third P-type transistor, gated by a first inverter output signal D1; and a fourth N-type transistor, connected in series to the third N-type transistor, gated by the clock signal CK. A drain of the third P-type transistor and a drain of the third N-type transistor may be connected to the first node.

The third circuit may include a fourth P-type transistor, configured to receive the power voltage, gated by the inverted clock signal CKB; a fifth N-type transistor, connected in series to the fourth P-type transistor, gated by the clock signal CK; and a sixth N-type transistor, connected in series to the fifth N-type transistor, having a gate connected to a second node. A drain of the fourth P-type transistor and a drain of the fifth N-type transistor may be connected to the second node.

The fourth circuit may include a second inverter, configured to receive an output signal QN from a third node and output an output signal QI; a fifth P-type transistor gated by the output signal QI; and a seventh N-type transistor, connected in series to the fifth P-type transistor, gated by the output signal QI of the second inverter. A drain of the fifth P-type transistor and a drain of the seventh N-type transistor may be connected to the third node. A source of the fifth P-type transistor may be connected to a drain of the first P-type transistor, and a source of the seventh N-type transistor may be connected to a drain of the second N-type transistor.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Embodiments of the present disclosure employ a complementary clock gate structure which is differentiated from the flip-flop structure of the related art so that only desired clock switching may occur. Further, the embodiments employ a merged transistor structure in which topologically/logically equivalent transistors are merged to reduce the number of transistors which are not desired in the flip-flop structure.

The flip-flop structure of the related art cannot operate at a low voltage due to characteristics susceptible to the variation or cannot have a high energy efficiency due to the redundant clock switching/transistors. In contrast, the present disclosure allows an operation at a low voltage and provides a high energy efficiency by excluding characteristics susceptible to the variation and removing the redundant clock switching/transistors with a minimum area.

Figure 2:
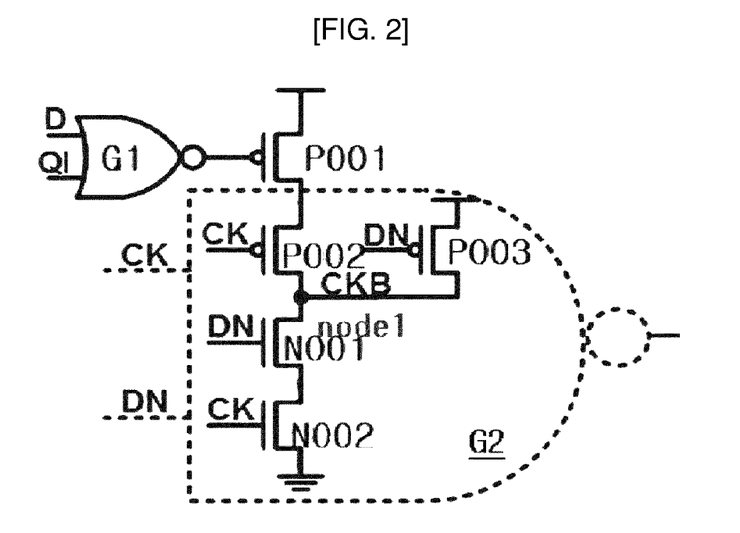
FIG. 2 is a complementary clock gate circuit according to a first embodiment of the present disclosure.

FIG. 2 is a complementary clock gate circuit according to a first embodiment of the present disclosure.

As illustrated in FIG. 2, the complementary clock gate circuit includes a NOR gate G1 which receives a data signal D and a signal QI, a first P-type transistor P001 which receives an output of the NOR gate G1 and receives a power voltage, and a NAND gate G2 which is connected to the first P-type transistor in series and receives a clock signal CK and an inverted data signal DN to output an inverted clock signal CKB.

The NAND gate G2 includes a second P-type transistor P002 which is connected to the first P-type transistor P001 in series and is gated to the clock signal CK, a first N-type transistor N001 which is connected to the second P-type transistor P002 in series and is gated to the inverted data signal DN, a second N-type transistor N002 which is connected to the first N-type transistor N001 in series and is gated to the clock signal CK, a first node Node1 which is connected to a drain of the second P-type transistor P002 and a drain of the first N-type transistor N001, and a third P-type transistor P003 which receives a power voltage and is gated to an inverted data signal DN. A drain of the third P-type transistor P003 is connected to the first node and outputs an inverted clock signal CKB.

The second N-type transistor N002 is grounded.

As illustrated in FIG. 2, in the complementary clock gate, according to the first embodiment of the present disclosure, when the inverted data signal DN is 0, the inverted clock signal CKB is 1. When the other clock signal CK is 1, the inverted clock signal CKB is 0. Further, when the other data signal D is 1, the clock signal CKB is 1, when the other inverted output signal QN is 0, the inverted clock signal CKB is 1, and when the other inverted output signal QN is 1, the inverted clock signal CKB is a high-Z state.

Figure 3:
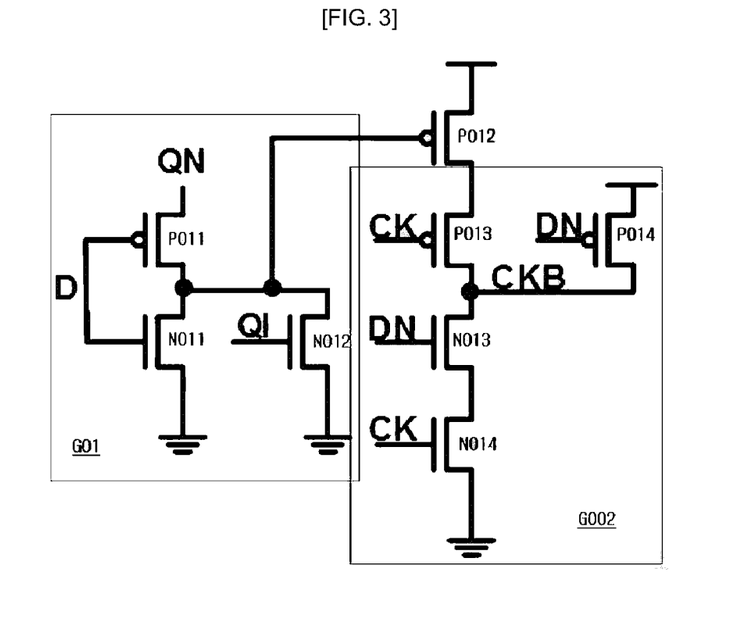
FIG. 3 is a complementary clock gate circuit according to a second embodiment of the present disclosure.

FIG. 3 is a complementary clock gate circuit according to a second embodiment of the present disclosure.

The complementary clock gate circuit according to a second embodiment of the present disclosure includes a first P-type transistor P011 which receives a signal QN and is gated by a data signal D, a first N-type transistor N011 which is connected to the first P-type transistor P011 in series and is gated by the data signal D, a first node Node01 which is connected to a drain of the first P-type transistor P011 and a drain of the first N-type transistor N011, a second P-type transistor P012 which receives a power voltage and has a gate connected to the first node Node01, a third P-type transistor P013 which is connected to the second P-type transistor P012 in series and is gated by a clock signal CK, a third N-type transistor N013 which is connected to the third P-type transistor P013 in series and is gated by the data signal DN, a fourth N-type transistor N014 which is connected to the third N-type transistor N013 in series and is gated by the clock signal CK, a second node Node02 which is connected to a drain of the third P-type transistor P013 and a drain of the third N-type transistor N013, a fourth P-type transistor P014 which receives a power voltage and is gated to an inverted data signal DN, and a second N-type transistor N012 which has a drain connected to the first node Node01 and is gated by QI which is an inverted QN.

A drain of the fourth P-type transistor P014 is connected to the second node and outputs an inverted clock signal CKB.

The first N-type transistor N011, the second N-type transistor N012, and the fourth N-type transistor N014 are grounded.

Figure 4:
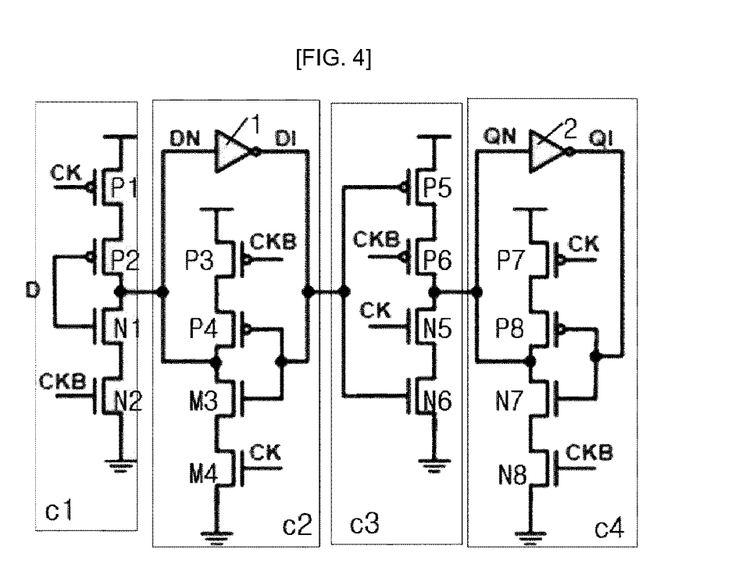
FIG. 4 is a low power flip-flop circuit including a complementary clock gate circuit according to a first embodiment of the present disclosure.

FIG. 4 is a low-power flip-flop circuit including a complementary clock gate according to one or more embodiments of the present disclosure.

As illustrated in FIG. 4, the low power flop-flop circuit may include a first circuit C1, a second circuit C2, a third circuit C3, and a fourth circuit C4 connected by nodes. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The first circuit C1 includes a first P-type transistor P1 which receives a power voltage and is gated by a clock signal CK, a second P-type transistor P2 which is connected to the first P-type transistor P1 in series and is gated by a data signal D, a first N-type transistor N1 which is connected to the second P-type transistor P2 in series and is gated by the data signal D, and a second N-type transistor N2 which is connected to the first N-type transistor N1 in series and is gated by an inverted clock signal CKB.

A source of the second N-type transistor N2 is grounded.

A drain of the second P-type transistor P2 and a drain of the first N-type transistor N1 are connected to a first node N1.

The second circuit C2 includes a first inverter 1, which is connected to the first node N1 in parallel and receives DN to output DI, a third P-type transistor P3 which receives a power voltage and is gated by an inverted clock signal CKB, a fourth P-type transistor P4 which is connected to the third P-type transistor P3 in series and is gated by a first inverter output signal D1, a third N-type transistor N3 which is connected to the fourth P-type transistor P4 in series and is gated by the inverter output signal D1, and a fourth N-type transistor N4 which is connected to the third N-type transistor N3 in series and is gated by a clock signal CK. A source of the fourth N-type transistor N4 is grounded.

The third circuit C3 includes a fifth P-type transistor P5 which receives a power voltage and is gated by the first inverter output signal D1, a sixth P-type transistor P6 which is connected to the fifth P-type transistor P5 in series and is gated by the inverted clock signal CKB, a fifth N-type transistor N5 which is connected to the sixth P-type transistor P6 in series and is gated by the clock signal CK, and a sixth N-type transistor N6 which is connected to the fifth N-type transistor N5 in series and is gated by the inverter output signal D1. A source of the sixth N-type transistor N6 is grounded.

A drain of the sixth P-type transistor P6 and a drain of the fifth N-type transistor N5 are connected to a second node.

The fourth circuit C4 includes a second inverter 2, which is connected to the second node N2 in parallel and receives QN to output QI, a seventh P-type transistor P7 which receives a power voltage and is gated by a clock signal CK, an eighth P-type transistor P8 which is connected to the seventh P-type transistor P7 in series and is gated by an output signal QI of the second inverter, a seventh N-type transistor N7 which is connected to the eighth P-type transistor P8 in series and is gated by the output signal QI of the second inverter, and an eighth N-type transistor N8 which is connected to the seventh N-type transistor N7 in series and is gated by an inverted clock signal CKB.

A source of the eighth N-type transistor N8 is grounded.

As illustrated in FIG. 4, the low power flip-flop circuit includes the complementary clock gate circuit of FIG. 2 to prevent redundant clock switching.

Figure 5:
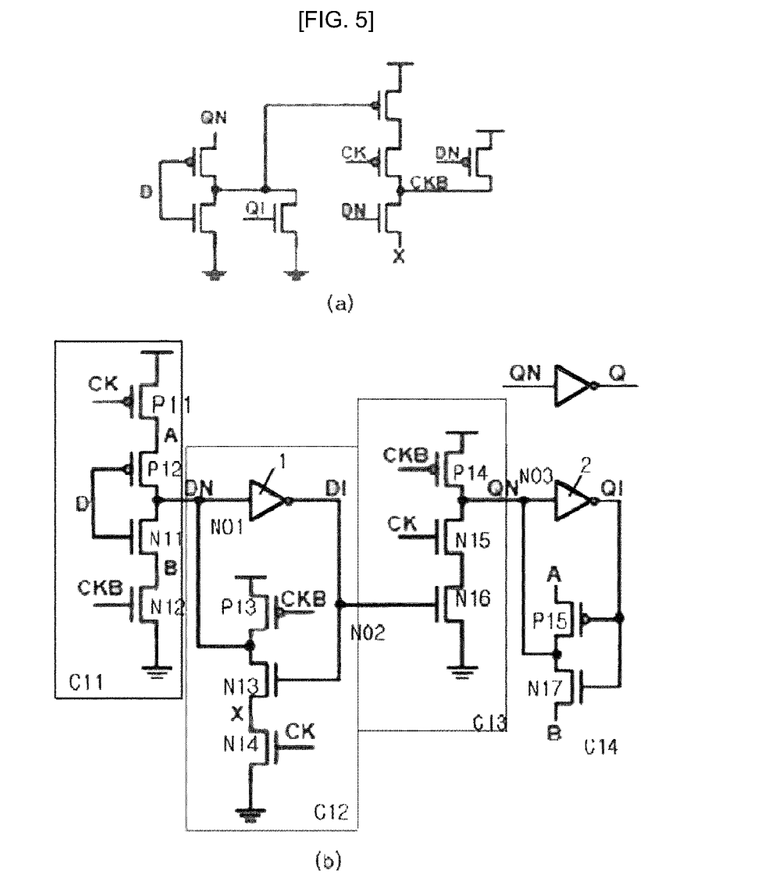
FIG. 5 is a low power flip-flop circuit including a complementary clock gate circuit according to a second embodiment of the present disclosure.

FIG. 5 is a low-power flip-flop circuit according to another embodiment of the present disclosure.

The low power flip-flop circuit, according to the embodiment of the present disclosure, is a low power flip-flop circuit including the complementary gate circuit of FIG. 5A. The complementary gate circuit of FIG. 5A has a structure in which logically equivalent transistors in the complementary gate circuit according to the second embodiment illustrated in FIG. 3 are merged to reduce the number of redundant transistors. To be more specific, it may be confirmed that in the complementary gate circuit of FIG. 5A, a circuit N014 is eliminated from the complementary gate circuit of FIG. 3. That is, it may be confirmed that in the complementary gate circuit of FIG. 5A, a circuit N014 of FIG. 3 is eliminated. That is, it may be confirmed that in the complementary gate circuit of FIG. 5A, the number of transistors is smaller than that in the complementary gate circuit of FIG. 3.

It may be understood that the flip-flop circuit illustrated in FIG. 5B applies the complementary gate circuit illustrated in FIG. 5A and reduces four transistors as compared with the flip-flop circuit of FIG. 4 to which the complementary gate circuit of FIG. 3 is applied. According to FIG. 5, the low power flip-flop circuit, according to the present disclosure's second embodiment of the present disclosure, may include a first circuit C11, a second circuit C12, a third circuit C13, and a fourth circuit C14 connected by nodes.

The first circuit C11 receives a data signal to output an inverted data signal DN.

The first circuit C11 includes a first P-type transistor P11, which receives a power voltage and is gated by a clock signal CK, a second P-type transistor P12 which is connected to the first P-type transistor P11 in series and is gated by a data signal D, a first N-type transistor N11 which is connected to the second P-type transistor P12 in series and is gated by the data signal D, and a second N-type transistor N12 which is connected to the first N-type transistor N11 in series and is gated by an inverted clock signal CKB. A source of the second N-type transistor N12 is grounded. A drain of the second P-type transistor P12 and a drain of the first N-type transistor N11 are connected to a first node N01.

The second circuit C12 receives an inverted data signal DN of the first circuit C11 to output a DI signal, an inverted signal of an inverted data signal.

The second circuit C12 includes a first inverter 1, which is connected to the first node N01 in parallel and receives DN to output DI, a third P-type transistor P13, which receives a power voltage and is gated by an inverted clock signal CKB, a third N-type transistor N13 which is connected to the third P-type transistor P13 in series and is gated by a first inverter output signal D1, and a fourth N-type transistor N14 which is connected to the third N-type transistor N13 in series and is gated by a clock signal CK. A source of the fourth N-type transistor N14 is grounded.

An output of the first inverter 11 and a gate of the third N-type transistor N13 are connected to a second node N02.

The third circuit C13 receives the DI signal and the clock signal and outputs an output signal QN dependent on the data signal when the clock signal is high.

The third circuit C13 includes a fourth P-type transistor P14, which receives a power voltage and is gated by the inverted clock signal CKB, a fifth N-type transistor N15 which is connected to the fourth P-type transistor P14 in series and is gated by the clock signal CK, and a sixth N-type transistor N16 which is connected to the fifth N-type transistor N15 in series and has a gate connected to the second node N02. A source of the sixth N-type transistor N16 is grounded.

A drain of the fourth P-type transistor P14 and a drain of the fifth N-type transistor N15 are connected to a third node Node3.

The fourth circuit C14 stores an output signal value QN of the third circuit C13.

The fourth circuit C14 includes a second inverter 2, which is connected to the third node N03 in parallel and receives QN to output QI, a fifth P-type transistor P15, which is gated by QI, and a seventh N-type transistor N17 which is connected to the fifth P-type transistor P15 in series and is gated by the output signal QI of the second inverter 2.

A drain of the fifth P-type transistor P15 and a drain of the seventh N-type transistor N17 are connected to the third node Node3.

A source of the fifth P-type transistor P15 is connected to a drain of the first P-type transistor P11, and a source of the seventh N-type transistor N17 is connected to a drain of the second N-type transistor N12. The source of the fifth P-type transistor P15 is connected to the drain of the first P-type transistor P11 so that the number of transistors may be reduced.

An x node of the complementary gate circuit of FIG. 5A corresponds to an x node of the flip-flop circuit of FIG. 5B.

As seen from FIGS. 2 and 3, the low power flip-flop circuit of the present disclosure generates the inverted clock signal CKB through the clock gate so that all the redundant clock switching is removed. Further, the number of transistors is reduced as compared with the related art, and a structure tolerant of the process variation is maintained.

Figure 6:
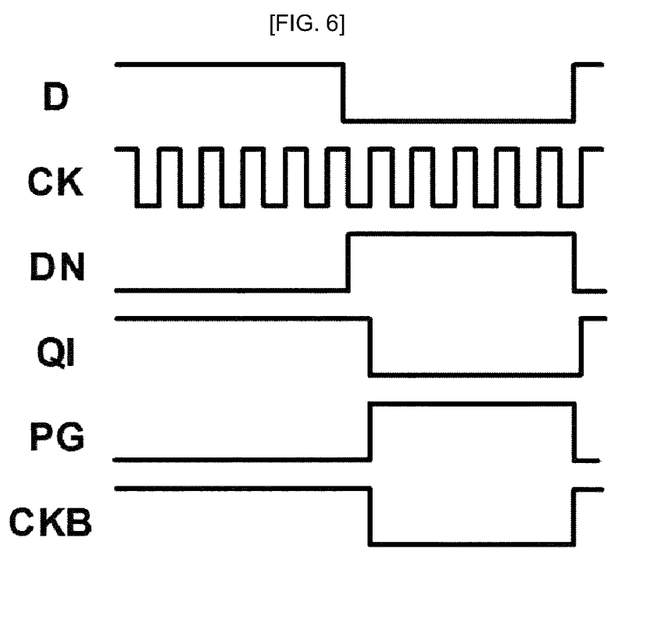
FIG. 6 is a waveform diagram example of a low power flip-flop circuit according to a second embodiment of the present disclosure.

FIG. 6 is an waveform diagram example of a low power flip-flop circuit according to a second embodiment of the present disclosure.

As seen from FIG. 6, it may be understood that in the low power flip-flop circuit, according to the second embodiment of the present disclosure, when the data signal D is high, the CKB is output to be high. When the data signal D is maintained to be 1, regardless of the change of the other signals CK, DN, A1, and PG, CKB maintains the existing value, and when the data signal D is switched, CKB is also switched.

Figure 7:
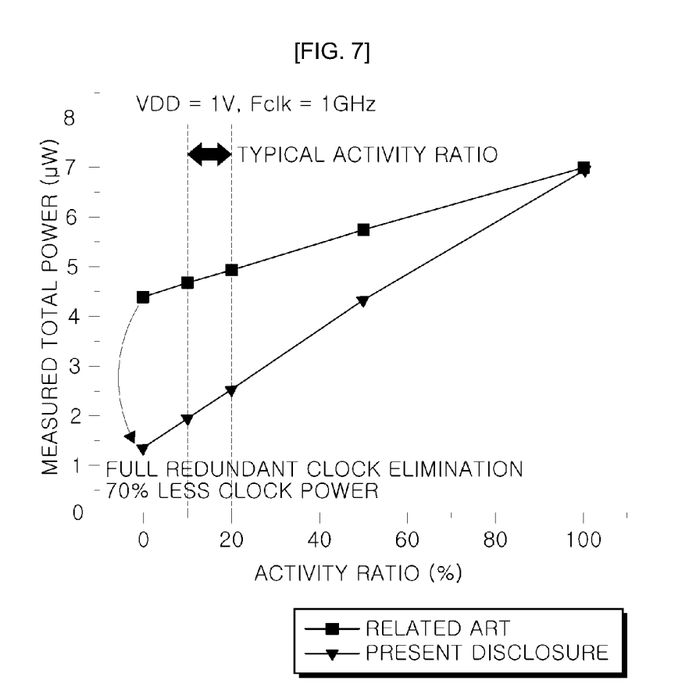
FIG. 7 is a graph illustrating power consumption according to one or more embodiments of the present disclosure.

FIG. 7 is a graph illustrating power consumption in accordance with a data activity ratio according to one or more embodiments of the present disclosure.

Referring to FIG. 7, a horizontal axis of the graph represents an activity ratio (%), and a vertical axis represents a measured total power (μW). 1 V of a voltage power is used and 1 GHz of a signal is employed.

It may be understood that the power consumption with respect to the overall activity ratio is significantly reduced as compared with the C2MOS of the related art.

Figure 8:
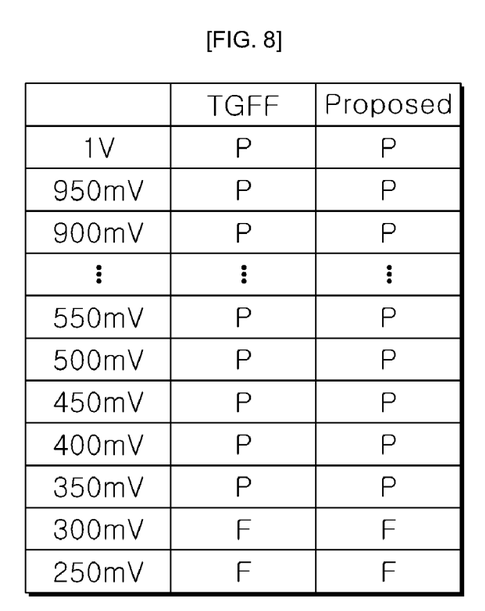
FIG. 8 is an operation measurement result of Monte-Carlo simulation to confirm a characteristic of a low power flip-flop circuit according to one or more embodiments of the present disclosure which is tolerant of a variation at a low voltage.

FIG. 8 is an operation measurement result of Monte-Carlo simulation to confirm a characteristic of a low power flip-flop circuit according to one or more embodiments of the present disclosure, which is tolerant of a variation at a low voltage.

Referring to FIG. 8, it may be understood that the result value of the C2MOS of the related art is the same as the result value of the low power flip-flop circuit of the present disclosure from 250 mV to 1 V as a result of the Monte-Carlo simulation.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A low-power flip-flop circuit, comprising:
    a first circuit configured to receive a data signal to output an inverted data signal as a first output signal;
    a second circuit configured to receive the inverted data signal of the first circuit and output a second output signal, wherein the second output signal is an inverted signal of the first output signal;
    a third circuit configured to receive the second output signal and a clock signal, and output a third output signal dependent on the data signal when the clock signal is high; and
    a fourth circuit configured to store an output signal value of the third circuit,
    wherein the second circuit comprises:
    a first inverter configured to receive the inverted data signal from a first node to output the second output signal;
    a first P-type transistor configured to receive a power voltage and gated by an inverted clock signal;
    a first N-type transistor directly connected in series to the first P-type transistor and gated by the second output signal; and
    a second N-type transistor connected in series to the first N-type transistor and gated by the clock signal CK,
    wherein a drain of the first P-type transistor and a drain of the first N-type transistor each are directly connected to the first node, and
    wherein the third circuit comprises a P-type transistor gated by the inverted clock signal and directly connected to an N-type transistor gated by the clock signal.

2. The low power flip-flop circuit of claim 1, wherein the first circuit comprises:
    a second P-type transistor, configured to receive the power voltage, and gated by the clock signal;
    a third P-type transistor, connected in series to the second P-type transistor, and gated by the data signal;
    a third N-type transistor, connected in series to the third P-type transistor, and gated by the data signal; and
    a fourth N-type transistor, connected in series to the third N-type transistor, and gated by the inverted clock signal, and
    wherein a drain of the third P-type transistor and a drain of the third N-type transistor are connected to the first node to output the inverted data signal as the first output signal.

3. The low power flip-flop circuit of claim 2, wherein the third circuit comprises:
    the P-type transistor, configured to receive the power voltage, and gated by the inverted clock signal CKB;
    the N-type transistor, directly connected in series to the P-type transistor, and gated by the clock signal; and
    a fifth N-type transistor, connected in series to the N-type transistor, and having a gate connected to a second node, and
    wherein a drain of the P-type transistor and a drain of the N-type transistor each are directly connected to a third node.

4. The low power flip-flop circuit of claim 3, wherein the fourth circuit comprises:
    a second inverter, configured to receive the third output signal from the third node and output a fourth output signal;
    a fourth P-type transistor gated by the fourth output signal; and
    a sixth N-type transistor, directly connected in series to the fourth P-type transistor, and gated by the fourth output signal, and
    wherein a drain of the fourth P-type transistor and a drain of the sixth N-type transistor are connected to the third node, and
    a source of the fourth P-type transistor is connected to a drain of the second P-type transistor, and a source of the sixth N-type transistor is connected to a drain of the fourth N-type transistor.

* * * * *